United States Patent
Saroka et al.

(10) Patent No.: US 8,907,682 B2
(45) Date of Patent: Dec. 9, 2014

(54) SYSTEM AND METHOD FOR CALIBRATION OF MEASUREMENTS OF INTERACTED EM SIGNALS IN REAL TIME

(75) Inventors: Amir Saroka, Tel-Aviv (IL); Nadav Mizrahi, Tel-Aviv (IL); Dan Rappaport, Tel-Aviv (IL); Shlomi Bergida, Tel-Aviv (IL)

(73) Assignee: Sensible Medical Innovations Ltd., Kfar Neter (IL)

( * ) Notice: Subject to any disclaimer, the term of this patent is extended or adjusted under 35 U.S.C. 154(b) by 213 days.

(21) Appl. No.: 12/846,861

(22) Filed: Jul. 30, 2010

(65) Prior Publication Data

US 2011/0025295 A1 Feb. 3, 2011

Related U.S. Application Data

(60) Provisional application No. 61/230,044, filed on Jul. 30, 2009.

(51) Int. Cl.
*G01R 27/04* (2006.01)
*G01R 35/00* (2006.01)

(52) U.S. Cl.
CPC ............................. *G01R 35/005* (2013.01)
USPC .......................................................... 324/637

(58) Field of Classification Search
None
See application file for complete search history.

(56) References Cited

U.S. PATENT DOCUMENTS

| | | |
|---|---|---|
| 3,534,727 A | 10/1970 | Roman |
| 4,016,868 A | 4/1977 | Allison |
| 4,240,445 A | 12/1980 | Iskander et al. |
| 4,279,257 A | 7/1981 | Hochstein |
| 4,381,510 A | 4/1983 | Wren |
| 4,488,559 A | 12/1984 | Iskander |
| 4,572,197 A | 2/1986 | Moore et al. |
| 4,580,572 A | 4/1986 | Granek et al. |
| 4,647,281 A | 3/1987 | Carr |
| 4,676,252 A | 6/1987 | Trautman et al. |
| 4,690,149 A | 9/1987 | Ko |
| 4,877,034 A | 10/1989 | Atkins et al. |

(Continued)

FOREIGN PATENT DOCUMENTS

| | | |
|---|---|---|
| EP | 0694282 | 1/1996 |
| WO | WO 99/39728 | 8/1999 |

(Continued)

OTHER PUBLICATIONS

Yamokoski et al "OptiVol® Fluid Status Monitoring With an Implantable Cardiac Device: A Heart Failure Managaement System.", 4:(6) 775-780 (doi:10.1586/17434440.4.6.775), Nov. 2007.

(Continued)

*Primary Examiner* — Arleen M Vazquez
*Assistant Examiner* — Feba Pothen

(57) ABSTRACT

A method of calibrating a measurement of electromagnetic (EM) signals. The method comprises separating at least one reference signal component from an EM signal, delaying at least one of the EM signal and the at least one reference signal component, extracting the EM signal after an interaction with a target object and the at least one reference signal component after at least one interaction with at least one reference element from different time slots in a reception, and calibrating a measurement of the interacted EM signal by a signal analysis of the extracted and interacted at least one reference signal component.

23 Claims, 8 Drawing Sheets

(56) References Cited

U.S. PATENT DOCUMENTS

| | | | |
|---|---|---|---|
| 4,920,969 A | 5/1990 | Suzuki et al. | |
| 4,926,868 A | 5/1990 | Larsen | |
| 4,958,638 A * | 9/1990 | Sharpe et al. | 600/407 |
| 4,991,585 A | 2/1991 | Mawhinney | |
| 5,002,060 A | 3/1991 | Nedivi | |
| 5,078,134 A | 1/1992 | Heilman et al. | |
| 5,132,623 A | 7/1992 | De et al. | |
| 5,282,840 A | 2/1994 | Hudrlik | |
| 5,334,141 A | 8/1994 | Carr et al. | |
| 5,363,050 A | 11/1994 | Guo et al. | |
| 5,394,882 A | 3/1995 | Mawhinney | |
| 5,479,120 A | 12/1995 | McEwan | |
| 5,517,198 A | 5/1996 | McEwan | |
| 5,523,760 A | 6/1996 | McEwan | |
| 5,563,605 A | 10/1996 | McEwan | |
| 5,573,012 A | 11/1996 | McEwan | |
| 5,576,627 A | 11/1996 | McEwan | |
| 5,604,531 A | 2/1997 | Iddan et al. | |
| 5,728,143 A | 3/1998 | Gough et al. | |
| 5,738,102 A | 4/1998 | Lemelson | |
| 5,749,369 A | 5/1998 | Rabinovich et al. | |
| 5,766,208 A | 6/1998 | McEwan | |
| 5,804,921 A | 9/1998 | McEwan et al. | |
| 5,805,110 A | 9/1998 | McEwan | |
| 5,807,257 A | 9/1998 | Bridges | |
| 5,829,437 A | 11/1998 | Bridges | |
| 5,833,711 A | 11/1998 | Schneider, Sr. | |
| 5,861,019 A | 1/1999 | Sun et al. | |
| 5,876,353 A | 3/1999 | Riff | |
| 5,883,591 A | 3/1999 | McEwan | |
| 5,947,910 A | 9/1999 | Zimmet | |
| 5,957,861 A | 9/1999 | Combs et al. | |
| 5,964,703 A | 10/1999 | Goodman et al. | |
| 5,995,863 A | 11/1999 | Farace et al. | |
| 6,015,386 A | 1/2000 | Kensey et al. | |
| 6,026,173 A | 2/2000 | Svenson et al. | |
| 6,061,589 A | 5/2000 | Bridges et al. | |
| 6,064,903 A | 5/2000 | Riechers et al. | |
| 6,111,415 A * | 8/2000 | Moshe | 324/640 |
| 6,169,925 B1 | 1/2001 | Villaseca et al. | |
| 6,211,663 B1 * | 4/2001 | Moulthrop et al. | 324/76.23 |
| 6,233,479 B1 | 5/2001 | Haddad et al. | |
| 6,236,889 B1 | 5/2001 | Soykan et al. | |
| 6,281,843 B1 | 8/2001 | Evtioushkine et al. | |
| 6,330,479 B1 | 12/2001 | Stauffer | |
| 6,332,087 B1 | 12/2001 | Svenson et al. | |
| 6,332,091 B1 | 12/2001 | Burns et al. | |
| 6,351,246 B1 | 2/2002 | McCorkle | |
| 6,417,797 B1 | 7/2002 | Cousins et al. | |
| 6,425,878 B1 | 7/2002 | Shekalim | |
| 6,459,931 B1 | 10/2002 | Hirschman | |
| 6,484,047 B1 | 11/2002 | Vilsmeier | |
| 6,487,428 B1 | 11/2002 | Culver et al. | |
| 6,488,677 B1 | 12/2002 | Bowman et al. | |
| 6,494,829 B1 | 12/2002 | New, Jr. et al. | |
| 6,496,711 B1 | 12/2002 | Athan et al. | |
| 6,512,949 B1 | 1/2003 | Combs et al. | |
| 6,551,252 B2 | 4/2003 | Sackner et al. | |
| 6,574,510 B2 | 6/2003 | Von Arx et al. | |
| 6,577,709 B2 | 6/2003 | Tarr | |
| 6,590,545 B2 | 7/2003 | McCorkle | |
| 6,675,045 B2 | 1/2004 | Mass et al. | |
| 6,682,480 B1 | 1/2004 | Habib et al. | |
| 6,687,523 B1 | 2/2004 | Jayaramen et al. | |
| 6,746,404 B2 | 6/2004 | Schwartz | |
| 6,766,201 B2 | 7/2004 | Von Arx et al. | |
| 6,770,070 B1 | 8/2004 | Balbierz | |
| 6,783,499 B2 | 8/2004 | Schwartz | |
| 6,788,262 B1 | 9/2004 | Adams et al. | |
| 6,802,811 B1 | 10/2004 | Slepian | |
| 6,809,701 B2 | 10/2004 | Amundson et al. | |
| 6,849,046 B1 | 2/2005 | Eyal-Bickels et al. | |
| 6,909,397 B1 | 6/2005 | Greneker, III et al. | |
| 6,917,833 B2 | 7/2005 | Denker et al. | |
| 6,954,673 B2 | 10/2005 | Von Arx et al. | |
| 6,972,725 B1 | 12/2005 | Adams | |
| 7,006,856 B2 | 2/2006 | Baker, Jr. et al. | |
| 7,024,248 B2 | 4/2006 | Penner et al. | |
| 7,047,058 B1 | 5/2006 | Dvorsky et al. | |
| 7,072,718 B2 | 7/2006 | Von Arx et al. | |
| 7,077,810 B2 | 7/2006 | Lange et al. | |
| 7,110,823 B2 | 9/2006 | Whitehurst et al. | |
| 7,116,276 B2 | 10/2006 | Lee | |
| 7,122,012 B2 | 10/2006 | Bouton et al. | |
| 7,135,871 B1 * | 11/2006 | Pelletier | 324/640 |
| 7,228,047 B1 * | 6/2007 | Szilagyi et al. | 385/134 |
| 7,229,415 B2 | 6/2007 | Schwartz | |
| 7,315,170 B2 * | 1/2008 | Sakayori | 324/601 |
| 7,316,658 B2 | 1/2008 | Gagne | |
| 7,330,034 B1 * | 2/2008 | Pelletier et al. | 324/640 |
| 7,387,610 B2 | 6/2008 | Stahmann et al. | |
| 7,445,605 B2 | 11/2008 | Overall et al. | |
| 7,450,077 B2 | 11/2008 | Waterhouse et al. | |
| 7,483,752 B2 | 1/2009 | Von Arx et al. | |
| 7,561,908 B2 | 7/2009 | Glukhovsky et al. | |
| 7,591,792 B2 | 9/2009 | Bouton | |
| 7,613,522 B2 | 11/2009 | Christman et al. | |
| 7,628,757 B1 | 12/2009 | Koh | |
| 7,674,244 B2 | 3/2010 | Kalafut et al. | |
| 7,686,762 B1 | 3/2010 | Najafi et al. | |
| 7,725,150 B2 | 5/2010 | Tupin, Jr. et al. | |
| 7,729,776 B2 | 6/2010 | Von Arx et al. | |
| 7,736,309 B2 | 6/2010 | Miller et al. | |
| 7,756,587 B2 | 7/2010 | Penner et al. | |
| 7,825,667 B2 | 11/2010 | Fang et al. | |
| 7,837,629 B2 | 11/2010 | Bardy | |
| 7,844,341 B2 | 11/2010 | Von Arx et al. | |
| 7,860,574 B2 | 12/2010 | Von Arx et al. | |
| 7,872,613 B2 | 1/2011 | Keilman et al. | |
| 8,032,199 B2 | 10/2011 | Linti et al. | |
| 8,235,949 B2 | 8/2012 | Hack et al. | |
| 2003/0036674 A1 | 2/2003 | Bouton | |
| 2003/0036713 A1 | 2/2003 | Bouton et al. | |
| 2003/0128808 A1 | 7/2003 | Kindlein et al. | |
| 2004/0006279 A1 | 1/2004 | Arad | |
| 2004/0073093 A1 | 4/2004 | Hatlestad | |
| 2004/0148021 A1 | 7/2004 | Cartledge et al. | |
| 2004/0186395 A1 | 9/2004 | Vastano | |
| 2004/0249257 A1 | 12/2004 | Tupin, Jr. et al. | |
| 2004/0249258 A1 | 12/2004 | Tupin, Jr. et al. | |
| 2004/0254457 A1 | 12/2004 | Van der Weide | |
| 2005/0107719 A1 | 5/2005 | Arad | |
| 2005/0124908 A1 | 6/2005 | Belalcazar et al. | |
| 2005/0149139 A1 | 7/2005 | Plicchi et al. | |
| 2005/0171396 A1 | 8/2005 | Pankratov et al. | |
| 2005/0177061 A1 | 8/2005 | Alanen et al. | |
| 2006/0058606 A1 | 3/2006 | Davis et al. | |
| 2006/0258952 A1 | 11/2006 | Stahmann et al. | |
| 2006/0293609 A1 | 12/2006 | Stahmann et al. | |
| 2007/0032749 A1 | 2/2007 | Overall et al. | |
| 2007/0066904 A1 | 3/2007 | Wiesmann et al. | |
| 2007/0088221 A1 | 4/2007 | Stahmann | |
| 2007/0123770 A1 | 5/2007 | Bouton et al. | |
| 2007/0163584 A1 | 7/2007 | Bohm et al. | |
| 2007/0238914 A1 | 10/2007 | Royalty et al. | |
| 2008/0097530 A1 | 4/2008 | Muccio et al. | |
| 2008/0103440 A1 | 5/2008 | Ferren et al. | |
| 2008/0200803 A1 | 8/2008 | Kwon et al. | |
| 2008/0283290 A1 | 11/2008 | Niino et al. | |
| 2008/0288028 A1 | 11/2008 | Larson et al. | |
| 2009/0043223 A1 | 2/2009 | Zhang et al. | |
| 2009/0149918 A1 | 6/2009 | Krulevitch et al. | |
| 2009/0227882 A1 | 9/2009 | Foo | |
| 2009/0228001 A1 | 9/2009 | Pacey | |
| 2009/0228075 A1 | 9/2009 | Dion | |
| 2009/0241972 A1 | 10/2009 | Keilman et al. | |
| 2009/0248129 A1 | 10/2009 | Keilman et al. | |
| 2010/0056907 A1 | 3/2010 | Rappaport et al. | |
| 2010/0256462 A1 | 10/2010 | Rappaport et al. | |
| 2011/0025295 A1 | 2/2011 | Saroka et al. | |
| 2011/0319746 A1 | 12/2011 | Kochba et al. | |
| 2013/0281800 A1 | 10/2013 | Saroka et al. | |

(56) References Cited

U.S. PATENT DOCUMENTS

FOREIGN PATENT DOCUMENTS

| WO | WO 00/71207 | 11/2000 |
|---|---|---|
| WO | WO 03/009753 | 2/2003 |
| WO | WO 2005/074361 | 8/2005 |
| WO | WO 2005/094369 | 10/2005 |
| WO | WO 2007/055491 | 5/2007 |
| WO | WO 2008/122056 | 10/2008 |
| WO | WO 2009/031149 | 3/2009 |
| WO | WO 2009/031150 | 3/2009 |
| WO | WO 2011/141915 | 11/2011 |

OTHER PUBLICATIONS

International Preliminary Report on Patentability Dated Sep. 15, 2011 From the International Bureau of WIPO Re. Application No. PCT/IL2010/000182.
Official Action Dated Apr. 4, 2012 From the US Patent and Trademark Office Re. U.S. Appl. No. 12/676,385.
Restriction Official Action Dated Jun. 7, 2012 From the US Patent and Trademark Office Re. U.S. Appl. No. 12/544,314.
Hill-Rom "The Vest® Airway Clearance System. Information for Physicians", Hill-Rom, Retrieved From the Internet, 3 P., Nov. 24, 2011.
Jafari et al. "Ultrawideband Radar imagingn System for Biomedical Applications", Journal of Vacuum Science and Technology A: Vacuum, Surfaces, and Films, 24(3): 752-757, May/Jun. 2006.
Li et al. "An Overview of Ultra-Wideband Microwave Imaging Via Space-Time Beamforming for Early-Stage Breast-Cancer Detection", IEEE Antennas and Propagation Magazine, 47(1): 19-34, Feb. 2005.
Meaney et al. "Near-Field Microwave Imaging of Biologically-Based Materials Using A Monopole Transceiver System", IEEE Transactions on Microwave Theory and Techniques, 46(1): 31-45, Jan. 1998.
Pedersen et al "An Investigation of the Use of Microwave Radiation for Pulmonary Diagnostics", IEEE Transactions on Biomedical Engineering, 23(5): 410-412, Sep. 1976.
Shea et al. "Contrast-Enhanced Microwave Imaging of Breast Tumors: A Computational Study Using 3D Realistic Numerical Phantoms", Inverse Problems, 26: 1-22, 2010.
Zhou et al. "On the Resolution of UWB Microwave Imaging of Tumors in Random Breast Tissue", IEEE International Symposium of the Antennas and Propagation Society, Jul. 3-8, 2005, 3A: 831-834, Jul. 2005.
International Preliminary Report on Patentability Dated Mar. 18, 2010 From the International Bureau of WIPO Re.: Application No. PCT/IL2008/001198.
International Preliminary Report on Patentability Dated Mar. 18, 2010 From the International Bureau of WIPO Re.: Application No. PCT/IL2008/001199.
International Search Report and the Written Opinion Dated Jun. 15, 2010 From the International Searching Authority Re.: Application No. PCT/IL2010/000182.
International Search Report Dated Feb. 4, 2009 From the International Searching Authority Re.: Application No. PCT/IL2008/001198.
International Search Report Dated Jan. 23, 2009 From the International Searching Authority Re.: Application No. PCT/IL2008/001199.
Written Opinion Dated Feb. 4, 2009 From the International Searching Authority Re.: Application No. PCT/IL2008/001198.
Written Opinion Dated Jan. 23, 2009 From the International Searching Authority Re.: Application No. PCT/IL2008/001199.
Azevedo et al "Micropower Impulse Radar", Science & Technologies Review, Feb. 17-29, 1996.
Billich "Bio-Medical Sensing Using Ultra Wideband Communications and Radar Technology", PhD Proposal, Department of Information and Telecommunication Technology—University of Trento, Italy—Jan. 2006 (10 pages).
Gentili et al "A Versatile Microwave Plethysmograph for the Monitoring of Physiological Parameters", IEEE Transactions on Biomedical Engineering 49(10) 1204-1210, Oct. 2002.
Juweid et al. "Positron-Emission Tomography and Assessment of Cancer Therapy", The New England Journal of Medicine, 354(5): 496-507, Feb. 2, 2006.
Kagawa et al. "Advanced Exercise Control Using Miniature ECG and 3D Acceleration Sensors", D&D Forum on Telemedicine Systems: Issues, design, Development and Standardization at Globecom 2008, New Orleans, Louisiana, USA, 23 P., Dec. 2, 2008.
Katzeff et al. "Exercise Stress Testing and an Electromechanical S Wace of the Electrocardiogram", South African Medical Journal, 49(27): 1088-1090, Jun. 28, 1975.
Kerckhoffs et al. "Homogeneity of Cardiac Contraction Despite Physiological Asynchrony of Depolarization: A Model Study", Annals of Biomedical Engineering, 31: 536-547, 2003.
Lee et al. "Noninvasive Tests in Patients With Stable Coronary Artery Disease", The New England Journal of Medicine, 344(24): 1840-1845, Jun. 14, 2001.
Park et al. "An Ultra-Wearable, Wireless, Low Power ECG Monitoring System", Proceedings of the IEEE Biomedical Circuits and Systems Conference, BioCAS 2006, London, UK, p. 241-244, Nov. 29-Dec. 1, 2006.
Pedersen et al "An Investigation of the Use of Microwave Radiation for Pulmonary Diagnostics", Communications—IEEE Transcations on Biomedical Engineering, p. 410-412, Sep. 1976.
Schiller "Noninvasive Monitoring of Tumors", The New England Journal of Medicine, 359(4): 418-420, Jul. 24, 2008.
Semenov et al. "Three-Dimensional Microwave Tomography: Initial Experimental Imaging of Animals", IEEE Transactions on Biomedical Engineering, XP011007196, 49(1): 55-63, Jan. 2002. Abstract, p. 56, col. 1, Lines 6, 7.
Smiseth et al. "Regional Left Ventricular Electric and Mechanical Activation and Relaxation", JACC, Journal of the American College of Cardiology, 47(1): 173-174, Jan. 3, 2006.
Thornton "Optimization of Protocols for Computed Tomography Coronary Angiography", Supplement to Applied Radiology, p. 54-62, Jun. 2002.
Zito et al "Wearable System-On-A-Chip Pulse Radar Sensors for the Health Care: System Overview", 21st Conference on Advanced Information Networking and Applications Workshop (AINAW'07), University of Pisa, Italy—2007, IEEE.
Zlochiver et al "A Portable Bio-Impedance System for Monitoring Lung Resistivity", Medical Engineering & Physics, 29:(1), 93-100.
Official Action Dated Sep. 13, 2012 From the US Patent and Trademark Office Re. U.S. Appl. No. 12/676,381.
Official Action Dated Dec. 19, 2012 From the US Patent and Trademark Office Re. U.S. Appl. No. 12/544,314.
Official Action Dated Dec. 20, 2012 From the US Patent and Trademark Office Re. U.S. Appl. No. 12/676,385.
Communication Pursuant to Rules 70(2) and 70a(2) EPC Dated Mar. 5, 2013 From the European Patent Office Re. Application No. 08808013.0.
Official Action Dated Feb. 8, 2013 From the US Patent and Trademark Office Re. U.S. Appl. No. 12/676,381.
Official Action Dated Mar. 25, 2013 From the US Patent and Trademark Office Re. U.S. Appl. No. 13/254,852.
Supplementary European Search Report and the European Search Opinion Dated Feb. 13, 2013 From the European Patent Office Re. Application No. 08789867.2.
Supplementary European Search Report and the European Search Opinion Dated Feb. 14, 2013 From the European Patent Office Re. Application No. 08808013.0.
Jiang et al. "Ultrasound-Guided Microwave Imaging of Breast Cancer: Tissue Phantom and Pilot Clinical Experiments", Medical Physics, 32(8): 2528-2535, Aug. 2005.
Kramer et al. "Dielectric Measurement of Cerebral Water Content Using a Network Analyzer", Neurological Research, 14: 255-258, Jun. 1992.
Nopp et al. "Dielectric Properties of Lung Tissue as a Function of Air Content", Physics in Medicine and Biology, 38(6): 699-716, Jun. 1993.

(56) References Cited

OTHER PUBLICATIONS

Communication Pursuant to Article 94(3) EPC Dated May 6, 2013 From the European Patent Office Re. Application No. 10712583.3.
Communciation Pursuant to Article 94(3) EPC Dated Sep. 27, 2013 From the European Patent Office Re. Application No. 08808013.0.
Communication Pursuant to Article 94(3) EPC Dated Oct. 29, 2013 From the European Patent Office Re. Application No. 08789867.2.
Official Action Dated Oct. 11, 2013 From the US Patent and Trademark Office Re. U.S. Appl. No. 12/544,314.
Official Action Dated Oct. 22, 2013 From the US Patent and Trademark Office Re. U.S. Appl. No. 12/676,381.
Translation of Notice of Reason for Rejection Dated Sep. 24, 2013 From the Japanese Patent Office Re. Application No. 2010-523644.
Applicant-Initiated Interview Summary Dated Dec. 11, 2013 From the US Patent and Trademark Office Re. U.S. Appl. No. 12/544,314.
Official Action Dated Dec. 12, 2013 From the US Patent and Trademark Office Re. U.S. Appl. No. 13/254,852.
Meaney et al. "Microwave Imaging for Neoadjuvant Chemotherapy Monitoring", First European Conference on Antennas and Propagation, EuCAP 2006, Nice, France, Nov. 6-10, 2006, p. 1-4, Nov. 2006.
Panetta "A Mathematical Model of Periodically Pulsed Chemotherapy: Tumor Recurrence and Metastasis in a Competitive Environment", Bulletin of Methematical Biology, 58(3): 425-447, 1996.
Advisory Action Before the Filing of an Appeal Brief Dated Jun. 6, 2013 From the US Patent and Trademark Office Re. U.S. Appl. No. 12/676,385.
Applicant-Initiated Interview Summary Dated Jul. 2, 2013 From the US Patent and Trademark Office Re. U.S. Appl. No. 12/676,381.
Applicant-Initiated Interview Summary Dated Jun. 13, 2013 From the US Patent and Trademark Office Re. U.S. Appl. No. 12/676,385.
Office Action Dated Jun. 5, 2013 From the Israel Patent Office Re. Application No. 214973 and Its Translation Into English.
Official Action Dated Jul. 1, 2014 From the US Patent and Trademark Office Re. U.S. Appl. No. 12/676,381.
Communication Pursuant to Article 94(3) EPC Dated Aug. 4, 2014 From the European Patent Office Re. Application No. 08808013.0.
Advisory Action Before the Filing of an Appeal Brief Dated Apr. 22, 2014 From the US Patent and Trademark Office Re. U.S. Appl. No. 13/254,852.
Communication Pursuant to Article 94(3) EPC Dated Mar. 19, 2014 From the European Patent Office Re. Application No. 08789867.2.
Official Action Dated Mar. 11, 2014 From the US Patent and Trademark Office Re. U.S. Appl. No. 12/544,314.
Applicant-Initiated Interview Summary Dated May 16, 2014 From the US Patent and Trademark Office Re. U.S. Appl. No. 13/254,852.
Communication Pursuant to Article 94(3) EPC Dated May 22, 2014 From the European Patent Office Re. Application No. 10712583.3.
Office Action Dated Apr. 28, 2014 From the Israel Patent Office Re. Application No. 214973 and Its Translation into English.

\* cited by examiner

SYSTEM AND METHOD FOR CALIBRATION OF MEASUREMENTS OF INTERACTED EM SIGNALS IN REAL TIME

RELATED APPLICATIONS

This application claims priority from U.S. Provisional Patent Application No. 61/230,044, filed on 30 Jul. 2009. The content of the above Application is incorporated by reference as if fully set forth herein.

FIELD AND BACKGROUND OF THE INVENTION

The present invention, in some embodiments thereof, relates to calibration of measurement processes and devices and, more particularly, but not exclusively, to methods and devices of calibrating units and systems of measuring and/or monitoring electromagnetic interactions with objects.

Various measurement units acquire data by delivering and measuring electromagnetic (EM) signals, such as microwaves and radio waves, for example Network Analyzers, and Time Domain Reflectometers (TDR). Such measurement units deliver EM signals toward a target object and measure RF signals which interact therewith, for example reflected, diffracted, and/or refracted therefrom and/or passing therethrough.

For increasing the robustness and accuracy of such measurement units, it is common to apply, from time to time, calibration processes which compensate for measurement setup inaccuracies. Such a calibration process is usually conducted by measuring the EM signals which are reflected from and/or passed through reference elements with known impedances, for example, Short, Load, Open and/or Through impedance values instead of measuring the EM signals which interact with an actual target object. The known impedances are sometimes referred to as calibration standard elements. The actual measurements of EM signals which interact with the calibration standard elements are compared to the expected known impedance values so as to derive a correction function or any other measurement manipulation which will correct the actual measurements to the expected values. Most calibration methods are based on the assumption that the measurements of the different calibration standards are conducted under sufficiently similar conditions. Similarly, it is assumed that the actual measurements are conducted in conditions sufficiently similar to the ones existing during the calibration process, for example temperature conditions, cable setup and arrangement and setup components.

SUMMARY OF THE INVENTION

According to some embodiments of the present invention there is provided a method of calibrating a measurement of electromagnetic (EM) signals. The method comprises a) separating at least one reference signal component from an EM signal, b) delaying at least one of the EM signal and the at least one reference signal component, c) extracting the EM signal after an interaction with a target object and the at least one reference signal component after at least one interaction with at least one reference element from different time slots in a reception, and d) calibrating a measurement of the interacted EM signal by a signal analysis of the extracted and interacted at least one reference signal component.

Optionally, the a)-d) are performed while measuring the EM signal for an analysis of at least one property of the target object.

Optionally, the at least one reference element has an impedance selected from a group consisting of a short impedance value, a load impedance value and an open impedance value.

Optionally, the method comprises directing the EM signal and the at least one reference signal component respectively toward the target object and the at least one reference element before the extracting.

Optionally, the method comprises performing the a) and/or b) a plurality of times to facilitate the intercepting of a plurality of reference signal components after a plurality of different interactions with a plurality of different reference elements in a plurality of different reference time slots and performing the signal analysis on the plurality of reference signal components.

More optionally, the plurality of times are simultaneous.

More optionally, the plurality of times are sequential.

Optionally, the method comprises transmitting the EM signal and intercepting the EM signal for monitoring a change in at least one dielectric property of the target object.

Optionally, the EM signal and the at least one reference signal component are not diverted by a switch.

Optionally, the separating and delaying are performed by an interaction with a reference element placed along an EM signal transmission path of the EM signal.

According to some embodiments of the present invention there is provided an apparatus of calibrating a measurement of electromagnetic (EM) signals. The apparatus comprises at least one splitter which separates at least one reference signal from an EM signal, at least one time delay unit which delays at least one of the EM signal and the at least one reference signal and a calibration module which extracts the EM signal after an interaction with a target object, and the at least one reference signal after at least one interaction with at least one reference element from different time slots in a reception and calculates a calibration of a measurement based on the EM signal according to a signal analysis of the extracted and interacted at least one reference signal.

Optionally, the apparatus comprises a transmitter which generates the EM signal, a receiver which intercepts the reception and a measuring unit performing the measurement.

More optionally, the apparatus comprises a cable of at least 0.05 meter which conducts the EM signal from the transmitter to the at least one splitter.

Optionally, the apparatus comprises at least one EM conducting element which directs the EM signal toward the target object and the at least one reference signal component toward the at least one reference element.

Optionally, the at least one splitter separates a plurality of reference signal components from the EM signal and the at least one time delay unit delaying each the reference signal component with a different delay, the calibrating unit receiving the plurality of reference signal components after a plurality of interactions with a plurality of reference elements each in a different time slot and performing the signal analysis according to the plurality of received reference signal components.

More optionally, the at least one splitter comprises a plurality of splitters which sequentially separate the plurality of reference signal components from the EM signal.

More optionally, the at least one time delay unit comprises a plurality of time delay elements each having a different delaying coefficient.

Optionally, the at least one reference element is designed to mimic at least one of a reflection and a response of a predefined target object.

Optionally, the EM signal passes through the target object during the respective interaction and the at least one reference element comprising an EM signal conducting element which conducts the reference signal component toward the calibrating unit which calculates the calibration accordingly.

Optionally, the calibrating unit repeats the extraction and calculation a plurality of times during a monitoring session based on the measurement.

According to some embodiments of the present invention there is provided a monitoring apparatus of performing a measurement of electromagnetic (EM) signals. The monitoring apparatus comprises a transmitter which generates an EM signal which is directed toward a target object, a receiver which intercepts the EM signal after an interaction with the target object, a measuring unit which performs a measurement of a property of the target object according to the interacted EM signal, and a calibration module which separates at least one reference signal component from the EM signal and computes a calibration for the measurement. The EM signal and the at least one reference signal component are not diverted by a switch.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF EMBODIMENTS OF THE INVENTION

Figure 1A:
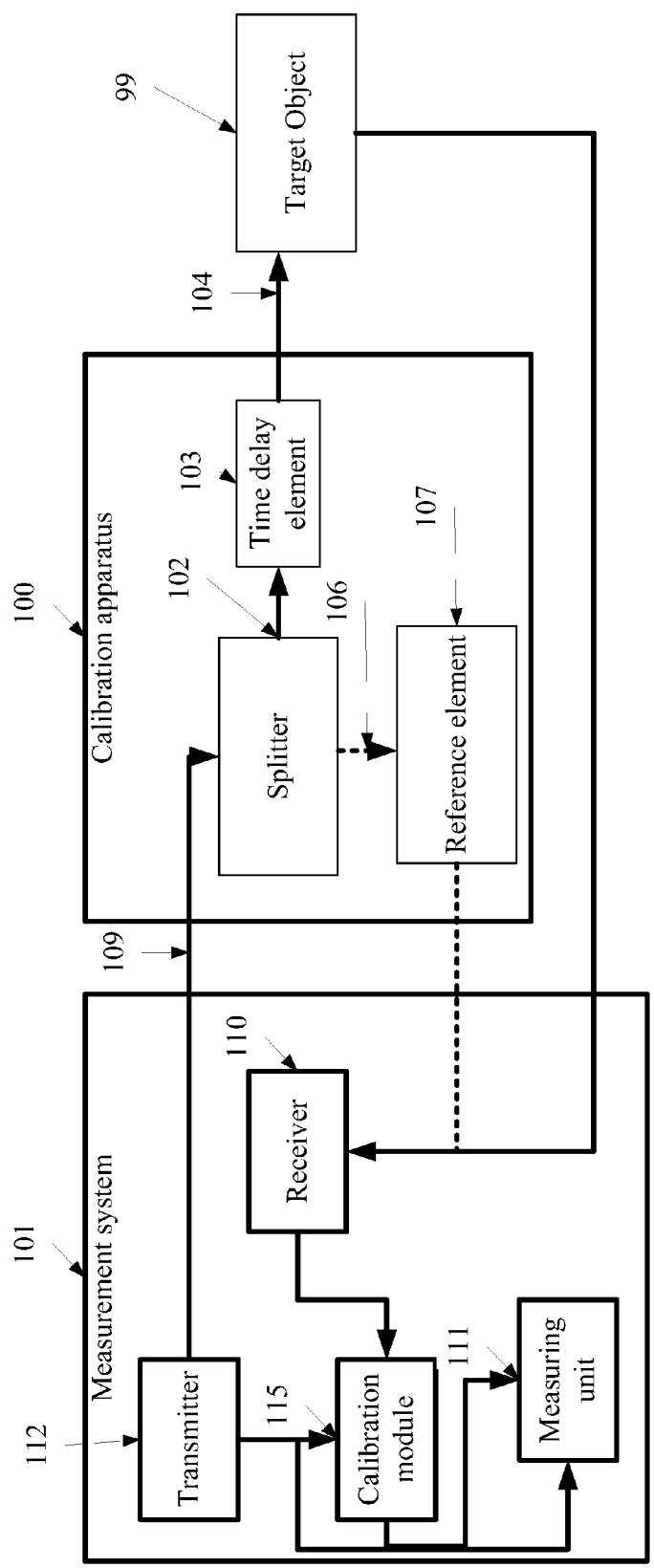
FIGS. 1A and 1B are schematic illustrations of exemplary calibration apparatuses of calibrating a measurement of EM signals, according to some embodiments of the present invention.

The present invention, in some embodiments thereof, relates to calibration of measurement processes and devices and, more particularly, but not exclusively, to methods and devices of calibrating units and systems of measuring and/or monitoring electromagnetic interactions with objects.

According to some embodiments of the present invention there are provided methods and systems for calibrating a measurement of an electromagnetic (EM) signal during a measurement process thereof by delaying the EM signal and/or its components in relation to one another. The method is based on separating one or more reference signal component components from the EM signals, for example using one or more splitters such as power splits. Then, the EM signal and/or the reference signal component components are delayed, for example using various time delay elements, passive and/or active. Now, a reception which includes the EM signal after an interaction with a target object and the one or more reference signal component components after one or more interactions with the one or more reference elements is intercepted. Now, the interacted EM signal and interacted reference signal component components are extracted from different time slots, an outcome of delaying EM signal or the reference signal component components in relation to another. This allows computing a calibration for a measurement of the interacted EM signal by a signal analysis of the extracted and interacted EM signal and the one or more extracted and interacted reference signal component components.

According to some embodiments of the present invention there is provided an apparatus of calibrating a measurement of EM signals that includes one or more splitters which separates one or more reference signal component components from an EM signal. Optionally, the splitters are arranged in a row along a transmission path to sequentially separate the reference signal component components. Optionally, a single splitter is used to separate a plurality of reference signal component components. The apparatus further includes one or more time delay elements which delay the EM signal and/or the reference signal component components. The time delay elements may be with a common delay coefficient or different delay coefficients. The apparatus further comprises a calibrating unit which extracts the EM signal after an interaction with a target object and the reference signal component components after one or more interactions with the reference element(s) from different time slots in a reception. This allows computing a calibration of a measurement of the EM signal according to a signal analysis of the extracted and interacted EM signal and the extracted and interacted reference signal component component(s).

According to some embodiments of the present invention there is provided an apparatus of performing a measurement of EM signals. The apparatus comprises a transmitter which generates an EM signal which is directed toward a target object and a receiver which intercepts the EM signal after an interaction with the target object. The apparatus further includes a measuring unit which performs a measurement of one or more properties of the target object according to the interacted EM signal and a calibration module which separates one or more reference signal component components from the EM signal and computes a calibration for the measurement where the EM signal or the one or more reference signal component components are not diverted by a switch.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1B:
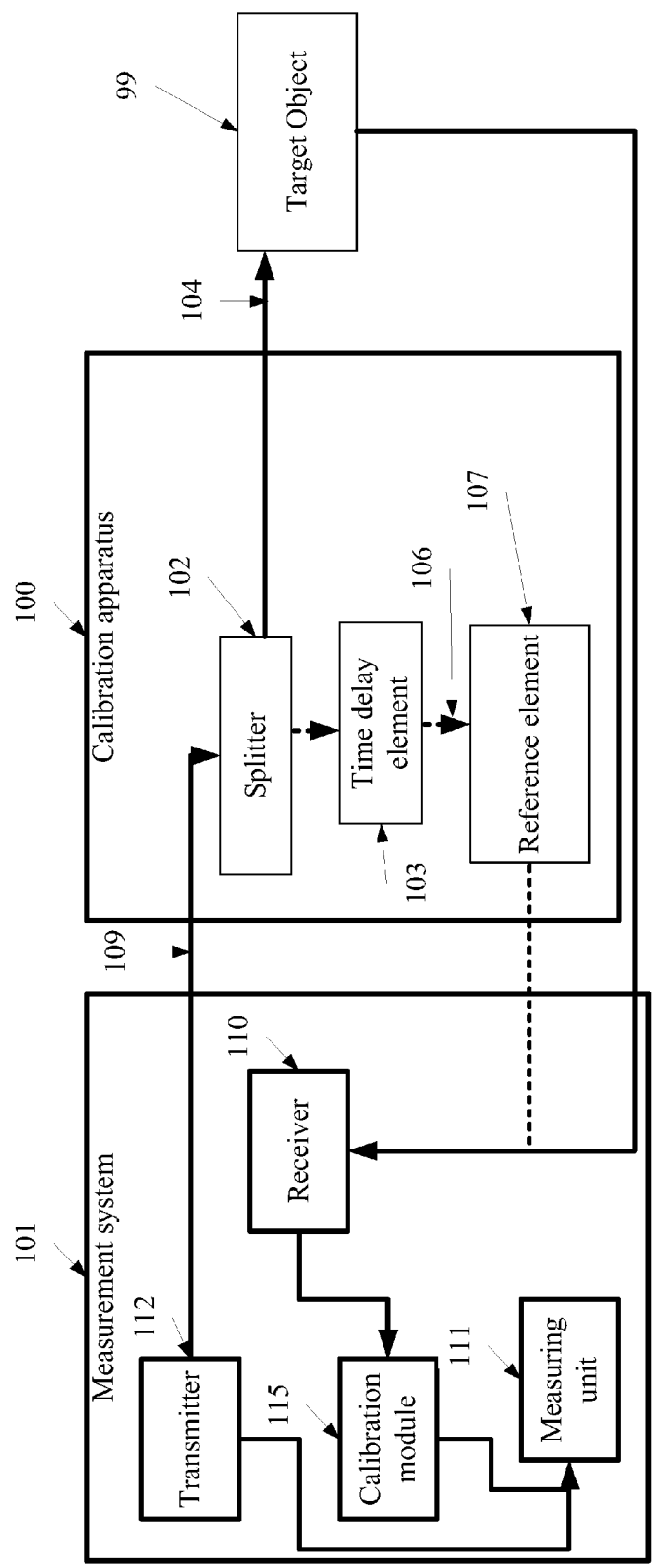

Reference is now made to FIGS. 1A and 1B which are schematic illustrations of exemplary calibration apparatuses 100 for calibrating a measurement of interacted EM signals, optionally during the operation of a calibrated measurement system 101, which is used to measure and/or monitor properties of a target object 99, according to some embodiments of the present invention. It should be noted that the continuous and dotted arrowed lines in all the figures depict the trajectories of signals and not limited to a certain physical line or path. For example, lines, such as opposing lines depict signals which are conducted over a common line or path.

The calibration apparatus 100 may be an independent unit that is added to the calibrated measurement system 101, for example as a calibration layer and/or integrated into the calibrated measurement system 101. Optionally, as further described below, the calibration apparatus 100 is integrated such that it is as close as possible to the target object 99, for example at the end of the connecting cables which conduct the EM signal, as shown at 109.

The calibrated measurement system 101 is a device which generates EM waves, referred to herein as an EM signal or EM signals, and intercepts the generated EM waves after an interaction with a target object for measuring one or more properties thereof. The calibrated measurement system 101 may be a probe, optionally mobile, which is set to monitor dynamic objects which may change or effect the conducting of the EM signal, for example the bending of the conducting cables and/or objects which are located in a changing environment which have an effect on the conducting of the EM signal, for example medical probes, general EM measurement devices or probes, portable geological probes, portable environmental probes, portable weather sensors, and the like. The target object 99 may be an organ, a living tissue, and/or a surface, a space, a medium and/or any physical object, volume or space. For example, the target object is an intrabody tissue, an underground space, an EM component, for example an EM filter, an EM attenuator, and the like. Optionally the EM signal is conducted to the target object 99 via direct connections such as cables and/or via a transducer and/or antenna which are used to deliver it to a body part, a medium and/or a space The calibration apparatus 100 includes one or more splitters 102, such as a power splitter, which is set to separate, for example by splitting one or more reference signal components from an EM signal generated by the calibrated measurement system 101. When a power splitter is used, the energy of the EM signal is divided in any selected ratio between and EM signal transmission path and one or more reference component paths. As used herein an EM signal transmission path is the path between the transmitter, such as 112, and the target object 99 and the reference component path which is the path between the splitter 102 and a reference element, such as 107. A power splitter may be a power divider, a coupler, a directional coupler, and/or the like. Optionally, the EM signal, shown at 109, is conducted via an EM signal conducting element, such as a cable, a fiber, a non-conducting medium, free-space, and/or a waveguide. Optionally the EM signal 109 can be directed to the calibration apparatus thru free-space or other non conducting medium for example using a wireless link. For brevity, the transmission and/or reception paths of the EM signal are depicted by a continuous line and the transmission and/or reception paths of the reference signal components is depicted by a dotted line. A combination of the EM signal and the reference signal components is also depicted by a continuous line. The transmission and/or reception paths may be conducted on separate EM signal conducting elements such as separate cables or may share a common EM signal conducting element. Specifically the transmission and reception paths connected to the measurement system and the target object may share a single cable that is connected using a single port to the measurement system and a single connection to the target object. This configuration may be used for measuring reflection properties of the target object.

The target object may be connected to the calibration apparatus 100 using an EM signal conducting element for conducting the EM signal depicted in 104, for example a fiber, a waveguide, a feedhorn, a cable, a transducer, an antenna, or combinations of more than one of these, for directing the EM signal toward the target object 99. In such a manner, the target object 99 is irradiated with the EM signals during the operation of the calibrated measurement system 101 while the reference signals are used for calibration. The EM signals interact with the target object 99, for example the EM signals which are reflected, diffracted, and/or refracted from the target object 99 and/or passing therethrough are received by the receiver 110 of the calibrated measurement system 101. The receiver 110 forwards the received signals to a calibration module 115 of the calibrated measurement system 101, facilitating the calibration process of the measurement which is held by the calibrated measurement system 101.

The calibration apparatus 100 further includes one or more time delay element 103, which delays one of the EM signal and the reference signal component(s) in relation to one another. The time delay element 103 may be any element that delays the EM signal or the reference signal component(s) in relation to one another, for example a PCB conductor, a cable having a high time delay coefficient, a filter, and/or a lumped element network component. The time delay element 103 may be active time delay elements. The time delay element 103 may have fixed and/or viable delays. For example, while in the arrangement depicted in FIG. 1A the EM signal is delayed, in the arrangement depicted in FIG. 1B the reference signal component is delayed. As one of the EM signal and the reference signal component(s) is delayed, they will be intercepted in different time slots. Therefore, the analysis of the content of a reception which combines both EM signal and the reference signal component(s) may be done by time division, for example as described below. Therefore, in such embodiments, any measurement, which is conducted by the calibrated measurement system 101 by a signal analysis of at least the interacted EM signal, may it be a sweep of a network analyzer (NA), a pulse of a time domain reflectometer (TDR) and/or any other, may take into account the time separation between the interacted EM signal and the interacted reference signal components. For example, time gating techniques may be used to separately analyze the interacted EM signal and/or the interacted reference signal components. Time gating techniques as used herein may include any frequency domain techniques which achieve equivalent separation of such time separated signals. As used herein an interacted signal is a signal which interacts with an object or a reference element, for example reflected, diverted, and/or refracted therefrom and/or passing therethrough.

The calibration apparatus 100 further includes an EM signal conducting element for conducting the reference signal components, shown at 106, such as fiber, a waveguide, a feedhorn, and/or a cable, for directing the reference signal component(s) toward one or more reference elements 107, such as calibration standards. The one or more reference elements 107 have preset known properties, such as a known impedances for example, Short, Load and/or Open impedance values and/or mass through reference element for example with a known impedance value, a component producing dielectric irregularities and/or a passing through component optionally producing dielectric irregularities. For example the reference element is a resistor of 50Ω.

The measurement system 101 intercepts a reception which combines the interacted EM signals and the one or more reference signal components after one or more interactions with the reference element(s) 107. The measurement system 101 further includes a calibration module 115 which extracts the one or more reference signal components from the EM signal by time division as each one of them is received in a different time slot. The extraction may be performed by dividing the reception into different time slots and analyzing each one of them separately. This allows the calibration module 115 to analyze the reference signal component(s) so as to calculate correction function to be used for calibration i.e. calculate a calibration or any other measurement manipulation for the actual measurements of the measuring unit 111. The correction may be of a measurement of the interacted EM signal according to the result of an analysis of the one or more reference signal components.

In some embodiments of the present invention, as described below, the calibration process is performed during the operation of the calibrated measurement system 101, and not under laboratory conditions. The calibration is an adaptive calibration which calibrates the measurement of the calibrated measurement system 101 at the state and/or environment it works. Moreover, as the calibration is performed during the operation of the calibrated measurement system 101. Each measurement of the calibrated measurement system 101 is accompanied by the reference signal component allowing its immediate, real-time, correction according to the calibration calculation. Thus the calibration process may be performed continuously, periodically, or at arbitrary intervals without putting the calibrated measurement system 101 on hold. It should be noted that as the calibration is performed in real time, typical practices of waiting for measurement system warm-up and stabilization may thus be avoided. In some embodiments of the present invention a periodic secondary classic calibration procedure can be performed by replacing the target object 99 by calibration standards, for example any of the Open, Short, Load, Through standards. This process may be used to periodically further correct for inaccuracies that may arise in the system; specifically this procedure can be used for compensating for changes in the calibration apparatus itself. This process may affect subsequent calculation of calibration functions by calibration module 115.

Optionally, the calibration module 115 computes calibration for the measurement of interacted EM signals which are directed toward the target object 99 via a medium which varies in time, such as a flexible bending cable which conducts the EM signal shown at 109. Such a calibration is optionally performed as a real-time calibration, optionally continuous, to compensate for the changing response of the cable.

Optionally, the one or more reference elements 107 have preset and/or known time and/or frequency response, for example passive or active elements. In some embodiments one or more calibrating elements are designed to mimic the reflection and/or response of a known target object in known conditions, for example known temperature, location, and/or distance. Such a reflection and/or a response is used to calibrate the calibrated measurement system 101 at typical working point and conditions minimizing any effects of nonlinearity in the system.

Optionally, the transmitted EM signal is configured to occupy broad frequency range allowing for high time resolution in time domain analysis of content of the reception. The high time resolution may allow smaller time delay values for the time delay elements with greater accuracy in the separation between the reference signal components and/or the interacted EM signal. Elements along the EM path may also be used to maintain frequency response flatness and thus improve high time resolution capabilities.

Optionally, the calibration apparatus 100 is enclosed in a housing at the end of the EM signal conducting element which conducts the EM signal depicted in 109, in proximity to the target object. Optionally, the calibration apparatus 100 is electromagnetically isolated, so as to minimize possible changes introduced in the un-calibrated paths between the calibration apparatus 100 and the target object 99.

Optionally, the calibration apparatus 100 and any EM signal conducting element which conducts the signal depicted in 104, are housed in a common housing in a rigidly and electromagnetically isolated constellation, and set to be attached to a moving target object.

It should be noted that as the calibration is of the interacted EM signal, it may take into account real time parameters which affect its properties. For example, the EM signal may be transmitted toward the target object 99 via a dynamic transmission path depicted in 109, such as a flexible cable of 0.05 meters, 1.5 meters, 3 meters, 6 meters, 9 meters, and any intermediate or larger length. The bending and/or curvature of such a cable may have an effect on the EM signal and therefore on the measurement of the interaction thereof with the target object 99. In such an embodiment, placing the one or more splitters 102 at the tip of the flexible cable allows separating one or more reference signal components after the EM signal passed through the flexible cable, taking into account its effect on the EM signal for the calibration.

The transmission of the EM signal and the reception of the EM signal and the one or more reference signal components may be performed via one or more ports.

Optionally, the transmitter 112 and the receiver 110 may be connected to different sides, optionally opposite, of the target object. In this case, the reception is of an interacted EM signal which passes through the target object. In such an embodiment one port is allocated for transmitting the EM signal and another for intercepting it after passing through the target object.

Figure 2:
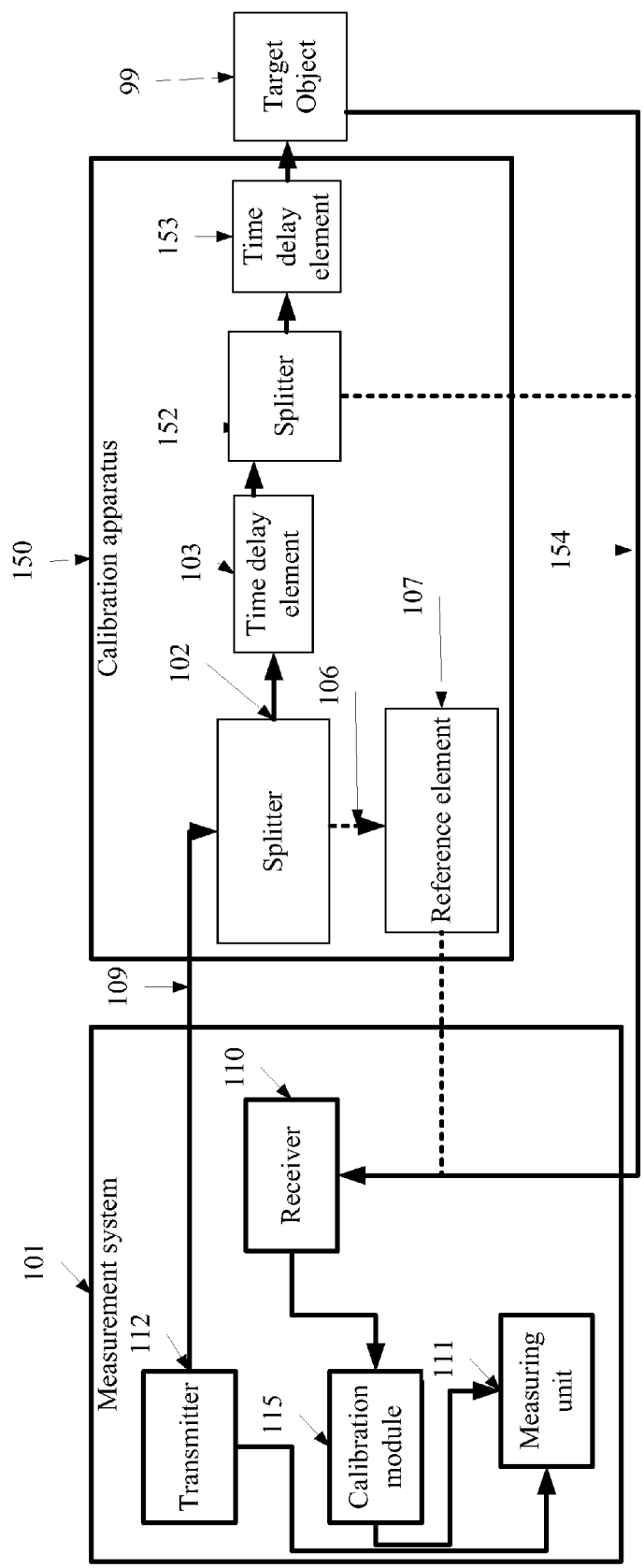
FIG. 2 is a schematic illustration of an exemplary calibration apparatus of calibrating a measurement of interacted EM signals having a passing through reference element, according to some embodiments of the present invention.

Reference is now also made to FIG. 2, which is a schematic illustration of an exemplary calibration apparatus 150 of calibrating a measurement of interacted EM signals which are passing through a target object, such as 99, according to some embodiments of the present invention. The components described in FIG. 2 are as depicted in FIG. 1A however the exemplary calibration apparatus 150 further includes a splitter 152 which splits the EM signal before it is directed toward the target object 99. The splitter 152 separates a passing through reference signal component which is directed via a passing through reference element, such as a cable 154, toward the receiver 110. The exemplary calibration apparatus 150 further includes a time delay element 153 which delays the EM signal before it is directed toward the target object 99. In such a manner, the passing through reference signal component and the interacted EM signal are intercepted in different time slots as one of them is delayed in relation to the other, for example as described above. The passing through reference signal component is received via the reception path. In use, the passing through reference signal component may be used to calibrate the measurement of a passing through EM signal as the passing through reference element has known properties, such as known impedance. In such an embodiment, the EM transmission and reception signal paths are connected to different ports of the calibrated measurement system 101. Optionally, the cable 154 is similar to the EM signal conducting element which conducts the EM signal toward the calibration apparatus 100 both introduce changes over time. It should be noted that time delay elements 103 may be added to separate temporally between the passing through reference signal component and the other reference signal components and the interacted EM signal, if needed.

Figure 3:
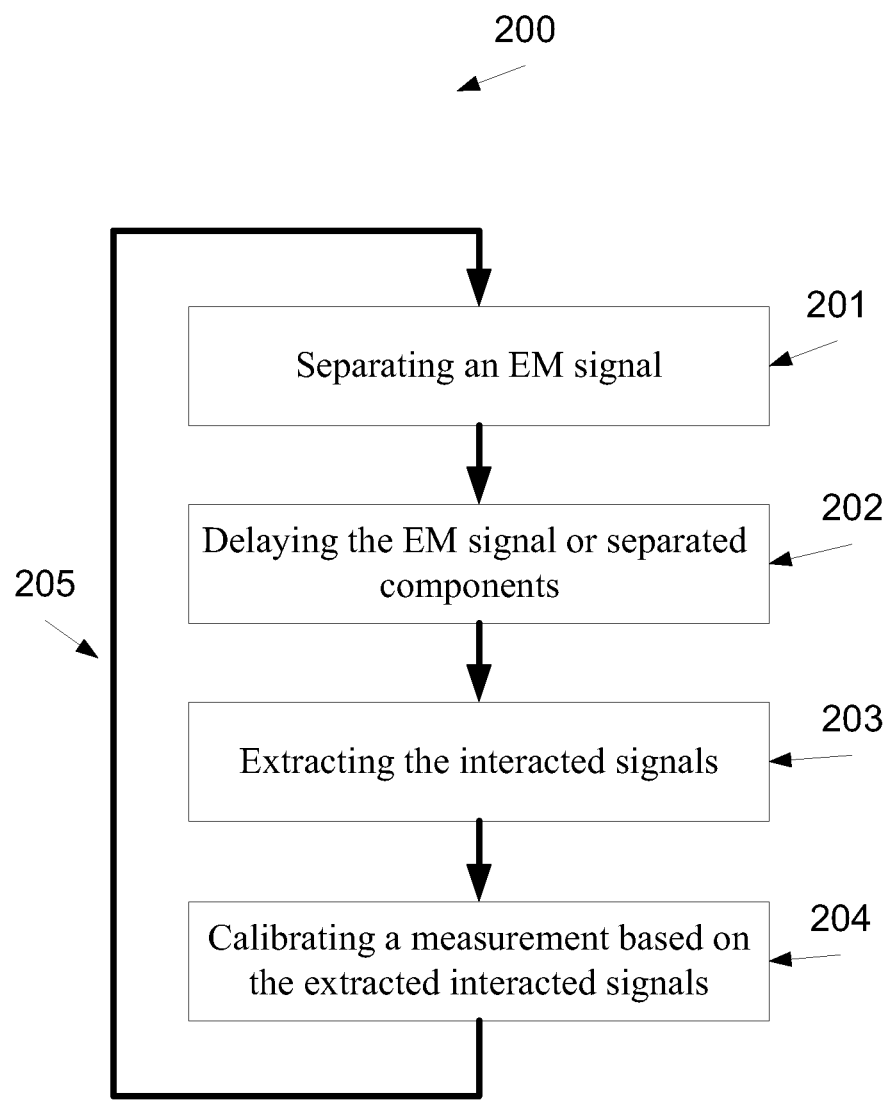
FIG. 3 is a flowchart of a method of calibrating a measurement of interacted EM signals, according to some embodiments of the present invention.

Reference is now also made to FIG. 3, which is a flowchart 200 of a method of calibrating a measurement of interacted EM signals, according to some embodiments of the present invention.

Figure 4:
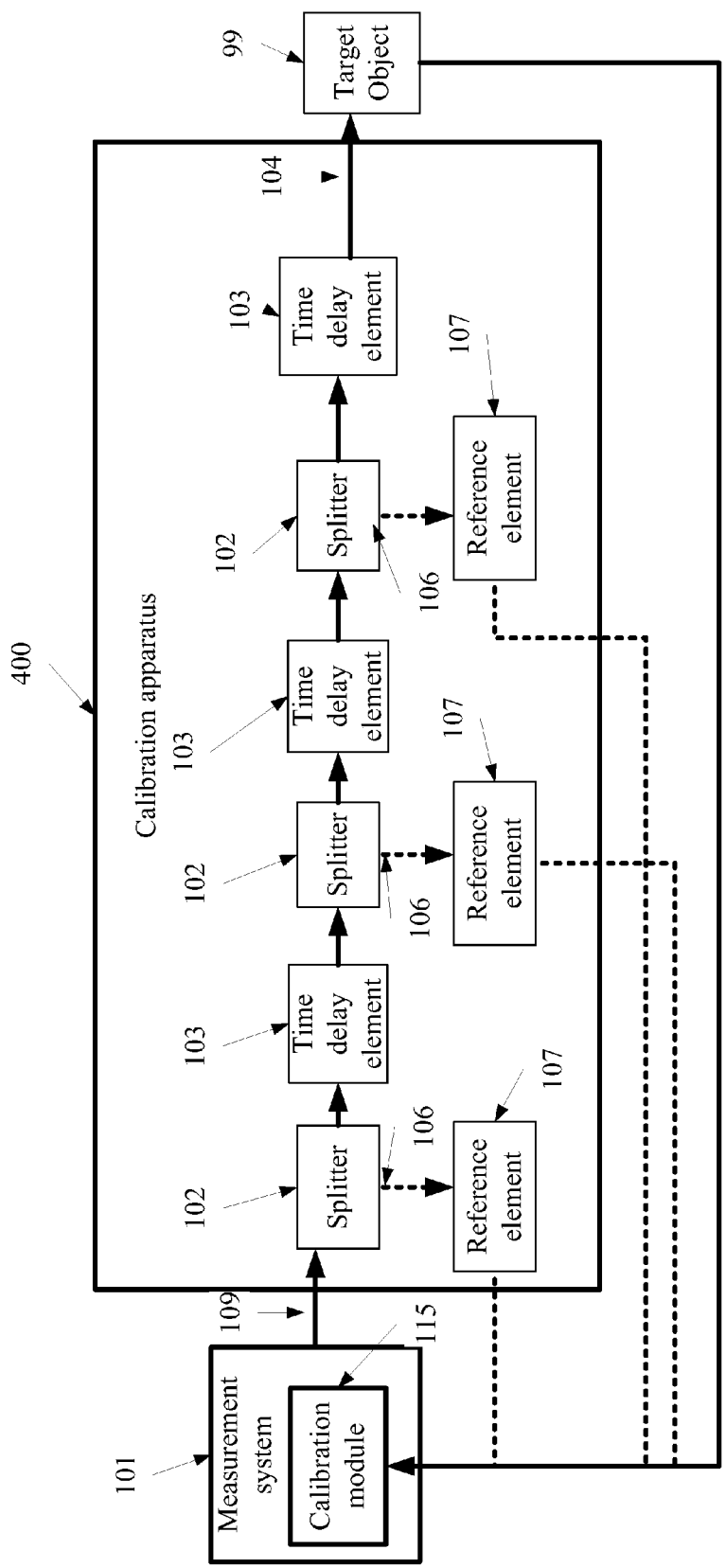
FIG. 4 is a schematic illustration of a calibration apparatus which comprises a plurality of splitters which are catenated along an EM signal transmission path, according to some embodiments of the present invention.

First, as shown at 201, one or more reference signal components are separated from an EM signal of a calibrated measurement system 101, for example using the splitter 102. The EM signal is generated by the transmitter 112 of the calibrated measurement system 101 and received via an EM signal conducting element, such as a flexible cable, for example the cable which conducts the EM signal shown at 109. Now, as shown at 202, the EM signal and/or the reference signal component(s) are delayed, for example using the time delay elements 103, 153. Optionally, a plurality of splitters, such as 102 and 152, are used to separates a plurality of reference signal components from the EM signal. In such a manner, interactions of a plurality of reference signal components with a plurality of reference elements may be probed. For example FIG. 4, depicts a calibration apparatus 400 which comprises a plurality of splitters 102 which are catenated along an EM signal transmission path. In such a manner, a plurality of reference signal components may be sequentially extracted from the EM signal of the calibrated measurement system 101. Each one of the separated reference signal component is directed to a different reference element 107. For example, the reference elements may be with Short, Load and/or Open impedance values. In such a manner, a set of reference signal components, each separately interacts with a difference reference element, is generated. In order to divide the reference signal components in time domain to different time slots, a plurality of time delay elements 103 are placed along the EM signal transmission path, between each pair of sequential splitters 102 and optionally after the last splitter 102. This means that when the EM signal arrives at each splitter 102 after passing via different number of time delay elements. Thus, each reference signal component has a different delay and therefore may be intercepted during a different time slot. The interacted reference signal components are also temporally separated different from the interacted EM signal, for example by placing another time delay element after the EM signal output of the last splitter, as shown in FIG. 4. It should be noted that though only 3 splitters and reference elements are depicted in FIG. 4, any number of splitters may be sequentially arranged along the EM signal transmission path.

Figure 5:
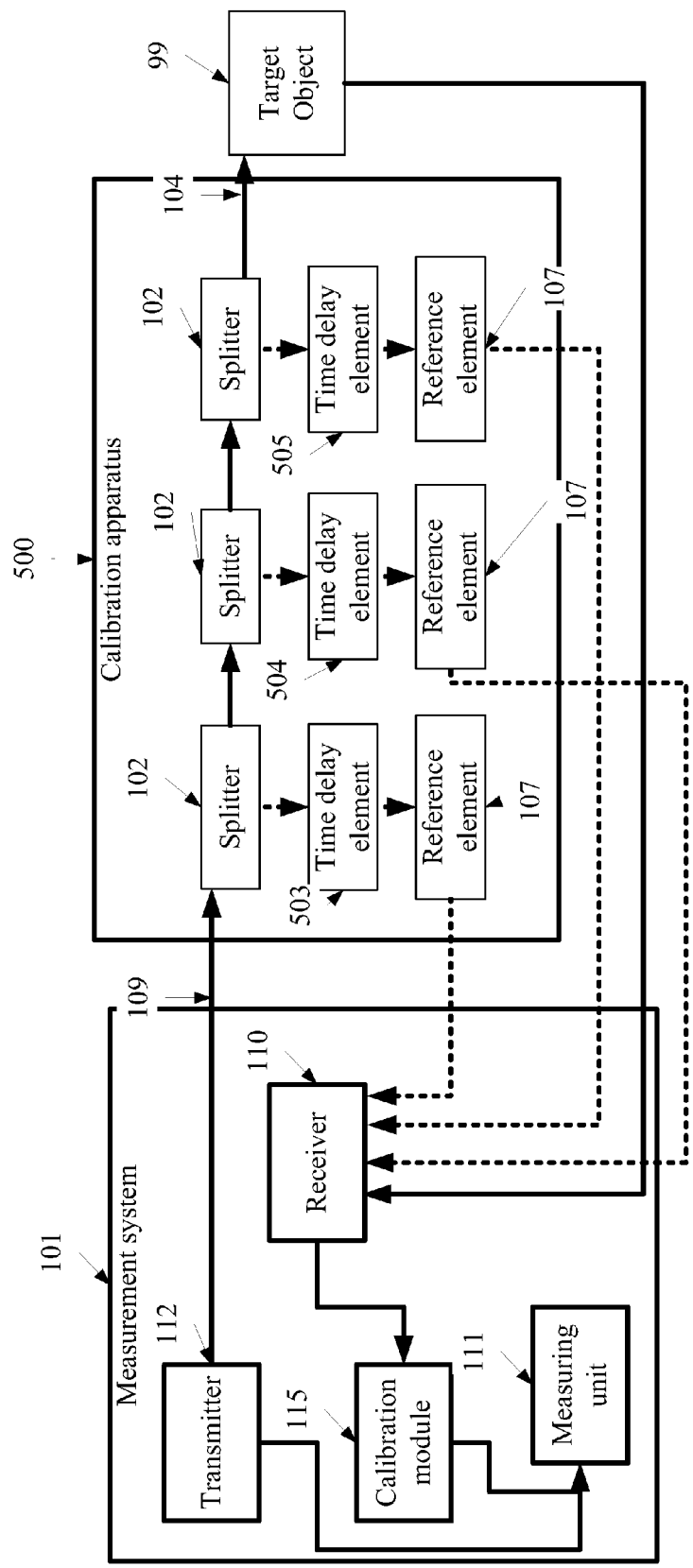
FIG. 5 is a schematic illustration of a calibration apparatus which comprises a plurality of time delay elements with different delay coefficients, according to some embodiments of the present invention.

In other embodiments of the present invention, for example as depicted in FIG. 5, a calibration apparatus 500 with time delay elements 503, 504, 505 with different delay coefficients may be used. In such a manner, each reference signal component may be intercepted in a different time slot. For example, time delay element 503 has a delay coefficient X, time delay element 504 has a delay coefficient Y, and time delay element 505 has a delay coefficient Z where Z>Y>X.

Figure 6:
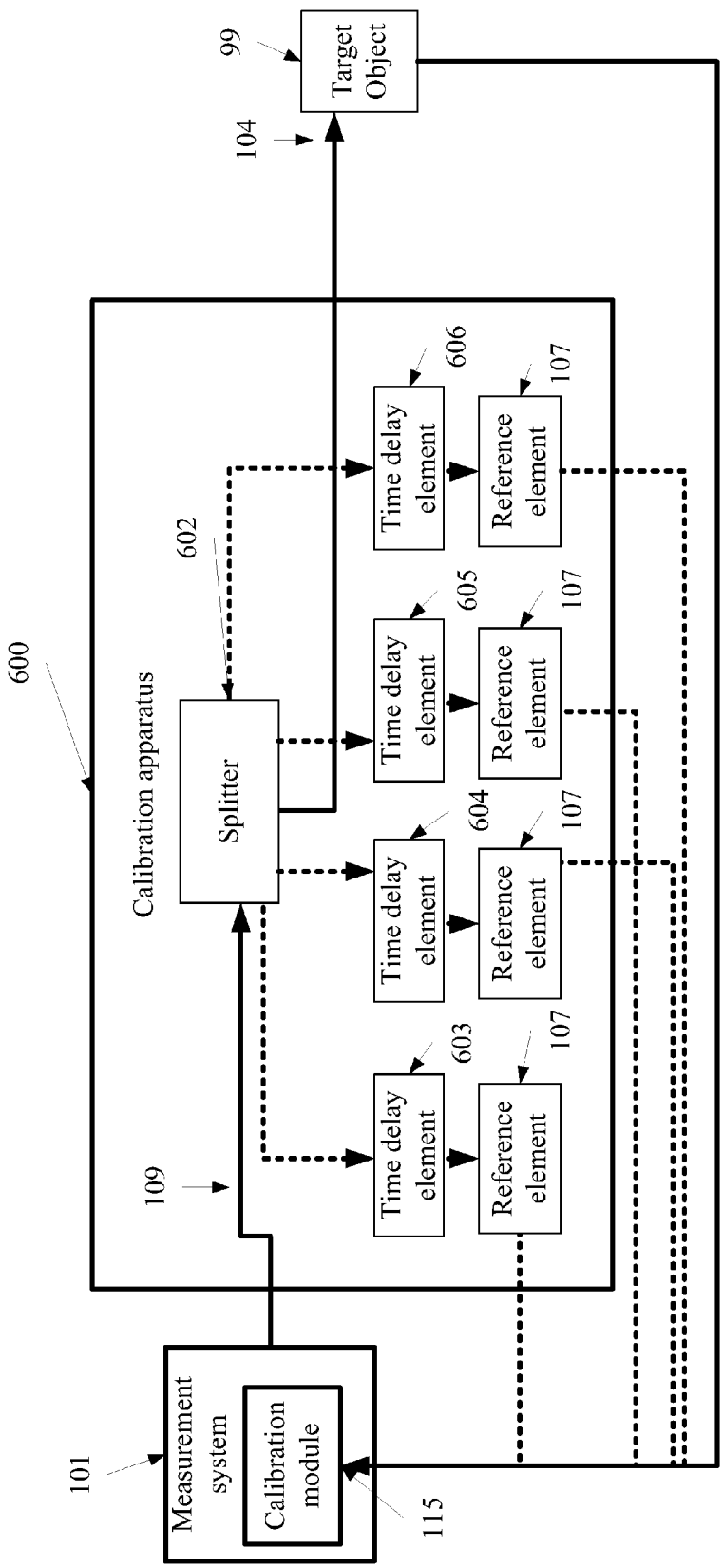
FIG. 6 is a is schematic illustration of a splitter which separates a plurality of reference signal components from an EM signal, according to some embodiments of the present invention.

In other embodiments of the present invention, for example as depicted in FIG. 6, a calibration apparatus 6a splitter 602 which separates a plurality of reference signal components from the EM signal is used. In such an embodiment, the time delay elements 603, 604, 605, and 606 with different delay coefficients are optionally used, for example as described above.

Reference is now made, once again, to FIG. 3. Now, as shown at 203, the calibration module 115 receives a reception and extracts the interacted EM signal from a measurement time slot and the one or more reference signal components, after interactions with one or more reference elements, from one or more different reference time slots. It should be noted that the calibration module 115 may be a module of the measuring unit 111.

This allows, as shown at 204, calibrating a measurement of the interacted EM signal according to the extracted interacted reference signal components.

As shown at 205, this process may be repeated during the operation of the calibrated measurement system 101 which generates the EM signal, for example continuously, periodically, or at arbitrary intervals without putting the calibrated measurement system 101 on hold and/or moving it away from a monitoring position and/or removing the target object in which is measures one or more properties of the target object 99.

It should be noted that the adding, connecting and/or embedding of the calibration apparatus 100 with and/or into the calibrated measurement system 101 does not prevent from an operator to calibrate the measurements of the calibrated measurement system 101 using other methods, for example by replacing the target object with a reference element with known impedance.

Optionally, the calibrated measurement system 100 is used to monitor body organs in order to identify changes that may occur, for example due to movement or pathological processes or reaction to a therapy or any other physiological or pathophysiological processes. For example, calibrated measurement system 101 is as defined in International PCT Patent Applications Nos. PCT/IL2008/001198 and/or PCT/IL2008/001199, both filed on Sep. 4, 2008 and incorporated herein by reference. In such embodiments, the calibrated measurement system 101 may be positioned on the body of the patient where a cable connects between the calibrated measurement system 101 and a transducer or antenna positioned on another part of the patient's body. In such embodiment, the target object is one or more tissues of the patient. The patient may be moving and/or induce movement of the cable. Such movements may imply a bending and/or twisting and/or other physical changes to the cable and therefore changes in its properties causing deviations and/or inaccuracies and/or inconsistencies in the measurement of the patient. Such changes may continuously change the measurement setup inhibiting accurate consistent measurements. In some measurement scenarios, although the patient is stationary, the transducers positioned on his upper thorax, for example, may still move as a result of the patient breathing. As described above, the calibration apparatus and method provide a calibration method which can be performed continuously, periodically, or at arbitrary intervals without putting the calibrated measurement system 101 on hold This allow calibrating measurement which is used for monitoring a patient without removing the calibrated measurement system 101 from his body.

Figure 7:
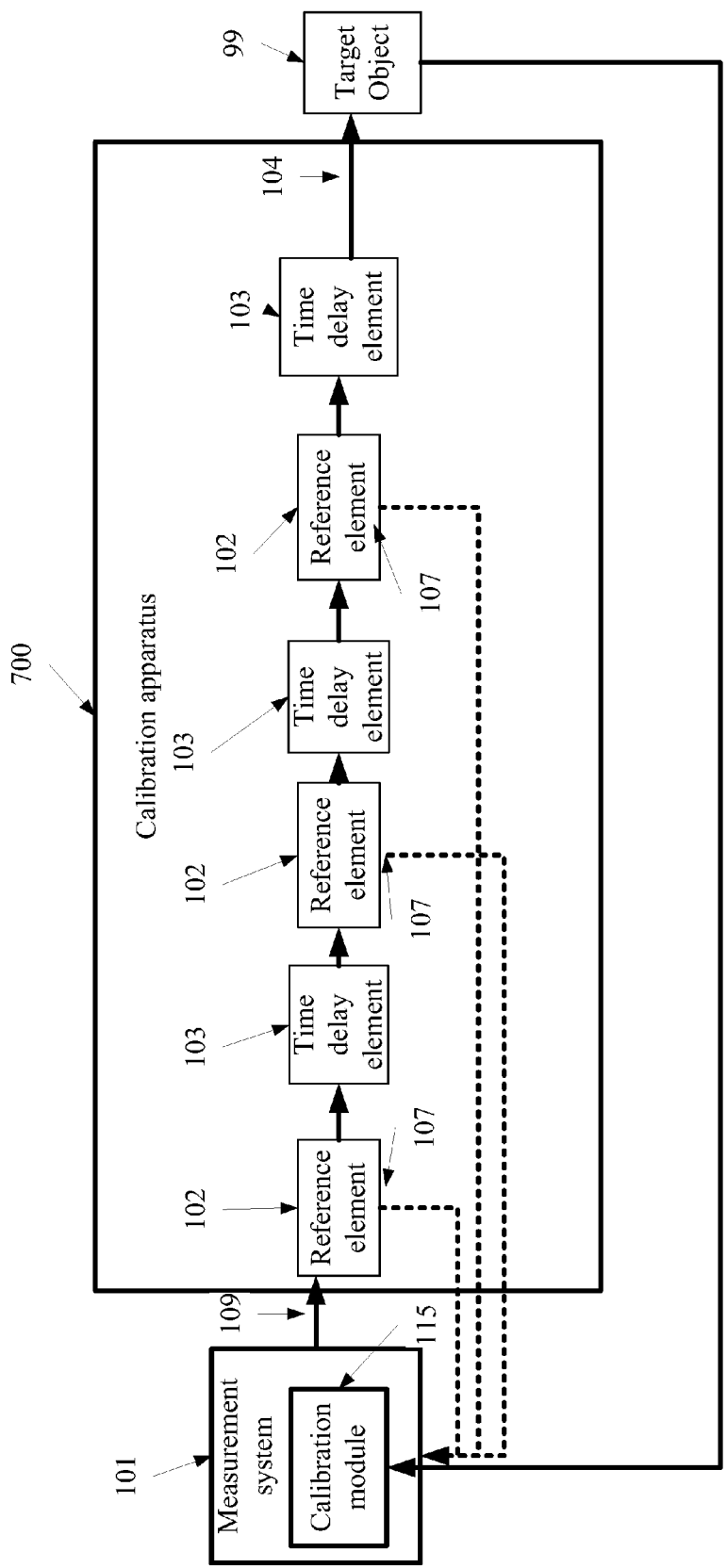
FIG. 7 is a schematic illustration of a calibration apparatus having an EM signal transmission path with the plurality of reference elements arranged therealong, according to some embodiments of the present invention.

Reference is now made to FIG. 7, which is a schematic illustration of a calibration apparatus 700 having an EM signal transmission path with the plurality of reference elements 107 arranged therealong, according to some embodiments of the present invention. These reference elements 107 are optionally passing through reference elements 107. For example, a reference element may be a cable, or a portion of cable having a narrowed diameter, a stub, or any component or element or a portion of a component or an element with irregularity in the impedance.

The components depicted in FIG. 7 are as depicted in FIG. 4, however in these embodiments no splitters 102 may be placed along the EM signal transmission path. Though 3 reference elements 107 are arranged along the EM signal transmission path, any number of them may be arranged along the EM signal transmission path, for example 1, 2, 4, 8 and any intermediate or larger number. In use, the EM signal interacts, optionally sequentially, with the reference elements 107. In each interaction, an interacted reference signal component is generated, for example reflected, and guided towards the calibration module, optionally on the same conducting elements of the EM signal, in an opposing direction. Such a reference element may be any mismatch or irregularity in the impedance in any conducting element between the source of the EM and the target object 99. In addition, an interacted EM signal, optionally a passing through EM signal, continues on the EM signal transmission path toward the target object 99. As shown at FIG. 7, the plurality of time delay elements 103 described above are also arranged along the EM signal transmission path, each one between two reference elements 107 and/or between the last reference element 107 and the target object. In such a manner, the interacted reference signal components, which are generated after interactions with different reference elements, are temporary separated from one another on a reception which combines them all. In addition, the interacted EM signal, which is intercepted after an interaction with the target object 99, is also temporary separated from each one of the reference elements. It should be noted that the analysis of the interacted EM signal optionally takes into account the effect of the reference elements 107. These effects may be calculated in advance in lab conditions.

It is expected that during the life of a patent maturing from this application many relevant methods and systems will be developed and the scope of the term sensors, probes, conducting elements, reference elements, transducer, transmitter and receiver is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of calibrating a measurement of electromagnetic (EM) signals, comprising:
    conducting an EM signal to a splitter via a dynamic transmission path having variation in at least one of a time response and a frequency response over time;
    separating at least one reference signal component from said EM signal using said splitter;
    delaying at least one of said EM signal and said at least one reference signal component;
    intercepting a reception that combines said EM signal after an interaction with a target object and said at least one reference signal component after at least one interaction with at least one reference element having at least one of a known time response and a known frequency response;
    extracting said EM signal after said interaction with said target object and said at least one reference signal component from said reception during different time slots; and
    compensating for said variation by calibrating a measurement of said interacted EM signal by a signal analysis of said extracted and interacted at least one reference signal component.

2. The method of claim 1, wherein said method is performed while measuring said EM signal for an analysis of at least one property of said target object.

3. The method of claim 1, wherein said at least one reference element has an impedance selected from a group consisting of a short impedance value, a load impedance value and an open impedance value.

4. The method of claim 1, further comprising directing said EM signal and said at least one reference signal component respectively toward said target object and said at least one reference element before said extracting.

5. The method of claim 1, further comprising performing said separating and/or delaying a plurality of times to facilitate the intercepting of a plurality of reference signal components after a plurality of different interactions with a plurality of different reference elements in a plurality of different reference time slots and performing said signal analysis on said plurality of reference signal components.

6. The method of claim 5, wherein said plurality of times are simultaneous.

7. The method of claim 5, wherein said plurality of times are sequential.

8. The method of claim 1, further comprising transmitting said EM signal and intercepting said EM signal for monitoring a change in at least one dielectric property of said target object.

9. The method of claim 1, wherein said EM signal and said at least one reference signal component are not diverted by a switch.

10. The method of claim 1, wherein said separating and delaying are performed by an interaction with a reference element placed along an EM signal transmission path of said EM signal.

11. An apparatus of calibrating a measurement of electromagnetic (EM) signals, comprising:
    a dynamic transmission path having variation in at least one of a time response and a frequency response over time;
    at least one splitter which receives an EM signal conducted via said dynamic transmission and separates at least one reference signal from said EM signal;
    at least one time delay unit which delays at least one of said EM signal and said at least one reference signal; and
    a calibration module which intercepts a reception that combines said EM signal after an interaction with a target object and said at least one reference signal after at least one interaction with at least one reference element having at least one of a known time response and a known frequency response and extracts said EM signal after said interaction with said target object and said at least one reference signal during different time slots of said reception, said calibration module compensates for said variation by calculating a calibration of a measurement based on said EM signal according to a signal analysis of said extracted and interacted at least one reference signal.

12. The apparatus of claim 11, further comprising a transmitter which generates said EM signal, a receiver which intercepts said reception and a measuring unit performing said measurement.

13. The apparatus of claim 12, further comprising a cable of at least 0.05 meter which conducts said EM signal from said transmitter to said at least one splitter.

14. The apparatus of claim 11, further comprising at least one EM conducting element which directs said EM signal toward said target object and said at least one reference signal component toward said at least one reference element.

15. The apparatus of claim 11, wherein said at least one splitter separates a plurality of reference signal components from said EM signal and said at least one time delay unit delaying each said reference signal component with a different delay, said calibrating unit receiving said plurality of reference signal components after a plurality of interactions with a plurality of reference elements each in a different time slot and performing said signal analysis according to said plurality of received reference signal components.

16. The apparatus of claim 15, wherein said at least one splitter comprises a plurality of splitters which sequentially separate said plurality of reference signal components from said EM signal.

17. The apparatus of claim 15, wherein said at least one time delay unit comprises a plurality of time delay elements each having a different delaying coefficient.

18. The apparatus of claim 11, wherein said at least one reference element is designed to mimic at least one of a reflection and a response of a predefined target object.

19. The apparatus of claim 11, wherein said EM signal passes through said target object during said respective interaction, and said at least one reference element comprising an EM signal conducting element which conducts said reference signal component toward said calibrating unit which calculates said calibration accordingly.

20. The apparatus of claim 11, wherein said calibrating unit repeats said extraction and calculation a plurality of times during a monitoring session based on said measurement.

21. A monitoring apparatus of performing a measurement of electromagnetic (EM) signals, comprising:
- a dynamic transmission path having variation in at east one of a time response and a frequency response over time;
- a transmitter which generates an EM signal which is directed via said dynamic transmission path toward a target object;
- a receiver which intercepts a reception that combines between said EM signal after an interaction with said target object and at least one reference signal component;
- a measuring unit which performs a measurement of a property of said target object according to said interacted EM signal; and
- a calibration module which separates said at least one reference signal component and said EM signal after said interaction with said, target object from said reception and computes a calibration for said measurement to compensate for said variation;
- wherein said EM signal and said at east one reference signal component are not diverted by a switch.

22. The apparatus of claim 11, wherein said dynamic transmission path comprises a flexible cable.

23. The apparatus of claim 22, wherein said flexible cable is at least 1.5 meters long.

* * * * *